(12) United States Patent
Wang et al.

(10) Patent No.: US 6,836,852 B2
(45) Date of Patent: Dec. 28, 2004

(54) METHOD FOR SYNCHRONIZING MULTIPLE SERIAL DATA STREAMS USING A PLURALITY OF CLOCK SIGNALS

(75) Inventors: Charles L. Wang, San Jose, CA (US); Benny W. H. Lai, Fremont, CA (US); Charles E. Moore, Loveland, CO (US); Philip W. Fisher, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 634 days.

(21) Appl. No.: 10/021,133

(22) Filed: Oct. 29, 2001

(65) Prior Publication Data

US 2003/0084362 A1 May 1, 2003

(51) Int. Cl.[7] .............................. G06F 1/04; G06F 1/06; G06F 13/42
(52) U.S. Cl. ....................... 713/400; 713/501; 713/502; 713/503; 713/600
(58) Field of Search ......................................... 713/400

(56) References Cited

U.S. PATENT DOCUMENTS 4,314,355 A * 2/1982 Leighou et al. ................ 710/61
6,000,037 A * 12/1999 Herbert ....................... 713/400
6,282,210 B1 * 8/2001 Rapport et al. ............. 370/518
2002/0040446 A1 * 4/2002 Doblar et al. ................ 713/400

FOREIGN PATENT DOCUMENTS

| EP | 0 044 402 | 6/1981 |
|---|---|---|
| GB | 2 009 980 A | 12/1978 |
| GB | 2 064 921 | 11/1980 |
| GB | 2 131 987 | 12/1983 |

OTHER PUBLICATIONS

"Electronics Design Support;" Gigahertz clocks, design support; www.engalco.fsnet.co.uk/new_page_16.htm; Sep. 24, 2001; 2 pgs.

* cited by examiner

Primary Examiner—Lynne H. Browne
Assistant Examiner—Matthew Henry

(57) ABSTRACT

Methods and systems for generating and synchronizing multiple clocks are disclosed herein that have extremely low skew across multiple channels and latency that is both minimal and well-defined. A phase-locked loop circuit generates a plurality of clock signals to synchronize channel circuits that receive core data streams. The channel circuits convert the core data streams into serial data streams. The phase-locked loop circuit or another phase-locked loop circuit generates a core clock signal for the registered transfer of the core data streams to the channel circuits. One or more of the plurality of clock signals may be distributed to the channel circuits by a register-to-register transfer.

17 Claims, 5 Drawing Sheets

METHOD FOR SYNCHRONIZING MULTIPLE SERIAL DATA STREAMS USING A PLURALITY OF CLOCK SIGNALS

BACKGROUND OF THE INVENTION

1. Field of the Invention

The present invention relates generally to electrical circuits and, more particularly, to the generation and synchronization of multiple clocks.

2. Related Art

Modern multi-channel data systems typically require parallel streams of data to be transmitted and received. The parallel data streams (or channels) can be aggregated into a smaller number of higher-bandwidth channels, which in data communications terms is commonly referred to as trunking. For the data to be aggregated, tight skew budgets are required of the system, where skew is defined as the phase relationship between each channel of data.

Serial data communications generally utilize a clock multiplier, such as a phase-locked loop (PLL) circuit. The PLL circuit phase and frequency locks to a reference clock and generates high-speed clocks to clock the data. To achieve low skew across multiple data paths (i.e., parallel data streams or data channels), the generated clocks must be carefully synchronized and aligned.

Typically, a PLL circuit or a delay-lock loop (DLL) circuit is utilized for each channel to reduce skew. For example, each PLL circuit is locked to a global reference signal whose distribution is tightly controlled. However, using numerous PLLs requires a significant amount of power and space, both of which are often very limited.

An alternative method utilizes a first-in first-out (FIFO) buffering scheme to cross clock domain boundaries for unsynchronized systems. One drawback is that a FIFO buffer introduces latency and skew. Also, for integrated circuits, the latency and skew may be uncontrolled over process, voltage, and temperature variations or corners. Furthermore, the FIFO buffers require additional logic to monitor and reset associated pointers and the FIFO buffers also consume valuable power and space.

BRIEF SUMMARY OF THE INVENTION

Methods and systems for generating and synchronizing multiple clocks are disclosed herein that have extremely low skew across multiple channels and latency that is both minimal and well-defined. These benefits are preserved across process, voltage, and temperature variations. The FIFO buffering scheme of the prior art, which introduces latency and skew, can be eliminated and, for example, the ability to use a single clock source is provided, which offers a reduction in power and area requirements.

In accordance with one embodiment of the present invention, a system for synchronizing a plurality of data channels includes a core circuit having a clock distribution circuit, with the core circuit providing a plurality of data streams at a frequency of a core clock signal carried by the clock distribution circuit. A first phase-locked loop circuit generates a plurality of clock signals, wherein a first clock signal from the plurality of clock signals has the same frequency and substantially the same phase as the core clock signal carried by the clock distribution circuit. A plurality of channel circuits are coupled to the core circuit and to the first phase-locked loop circuit, with the channel circuits converting the plurality of data streams, received at a frequency of the first clock signal, into a plurality of serial data streams at a frequency of a second clock signal from the plurality of clock signals. The first phase-locked loop circuit or a second phase-locked loop circuit may provide the core clock signal to the clock distribution circuit.

In accordance with another embodiment of the present invention, a method of synchronizing a plurality of data channels includes receiving a reference clock signal; generating a plurality of clock signals based on the reference clock signal and providing a core clock signal from the plurality of clock signals to a core circuit, wherein data is transferred from the core circuit through a plurality of data paths at a clock rate of the core clock signal; receiving the data, transferred through the plurality of data paths, by corresponding channel circuits at a clock rate of a first clock signal from the plurality of clock signals, the first clock signal having the same frequency and substantially the same phase as the core clock signal; and transforming the data received by each of the channel circuits from a parallel to a serial data stream at a clock rate of a second clock signal from the plurality of clock signals.

A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

The preferred embodiments of the present invention and their advantages are best understood by referring to the detailed description that follows. It should be appreciated that like reference numerals are used to identify like elements illustrated in one or more of the figures.

DETAILED DESCRIPTION OF THE INVENTION

Figure 1:
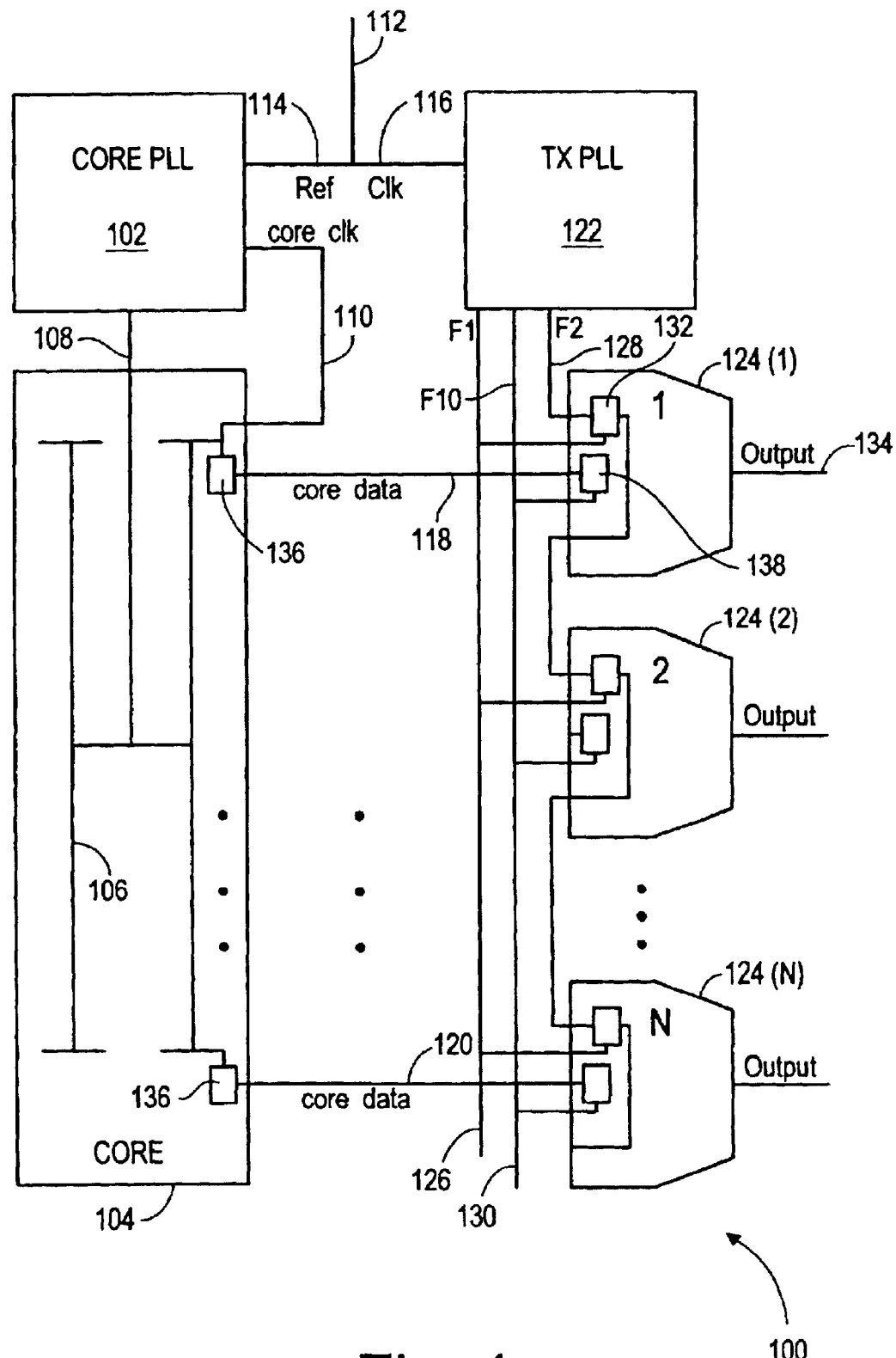
FIG. 1 shows a block diagram illustrating a system for generating and synchronizing multiple clocks in accordance with an embodiment of the present invention.

FIG. 1 shows a block diagram illustrating a system 100 for generating and synchronizing multiple clocks in accordance with an embodiment of the present invention. System 100 includes a core phase-locked loop (PLL) 102, a core circuit 104, a transmit PLL 122, and channel circuits 124.

System 100 receives a reference clock signal through a reference clock line 112. Reference clock line 112 provides the reference clock signal to core PLL 102 and to transmit PLL 122 through matched lines 114 and 116, respectively. Thus, as explained in further detail below, Core PLL 102 and transmit PLL 122 each receives the reference clock signal having the same frequency and substantially the same phase.

Core PLL 102 receives the reference clock signal through matched line 114 and provides a core clock signal through a core clock line 108 to core circuit 104. The core clock signal is distributed through core circuit 104 through a clock distribution circuit 106 having registers 136 for registering and providing core data to channel circuits 124. Core circuit 104 and clock distribution circuit 106, as illustrated in FIG. 1, can be of varying size, with core circuit 104 generating the core data and transmitting the data to channel circuits 124 through multiple (i.e., parallel) data paths, which are exemplified by core data lines 118 and 120.

Transmit PLL 122 receives the reference clock signal through matched line 116 and provides a serial (i.e., serial bitrate) clock signal through a serial clock line 126 (labeled F1 in FIG. 1) to each channel circuit 124. Transmit PLL 122 also provides a first sub-rate clock signal through a first sub-rate clock line 128 (labeled F2 in FIG. 1) and a second sub-rate clock signal through a second sub-rate clock line 130 (labeled F10 in FIG. 1). For example, the first sub-rate clock signal is one-half the frequency and the second sub-rate clock signal is one-tenth the frequency of the serial clock signal, which operates at the serial bitstream or bitrate frequency of channel circuits 124. It should be understood that the first and second sub-rate clock signals are exemplary and that various synchronized clock signals having varying duty cycles may be provided by transmit PLL 122.

Channel circuits 124, which are separately referenced in FIG. 1 as 124(1), 124(2), . . . , 124(N), represent a number of channels that receive the core data generated by core circuit 104. The core data are transferred from registers 136 in core circuit 104 to corresponding registers 138 in channel circuits 124. Channel circuits 124, for example, each include a serializer (not shown in FIG. 1, but described in further detail below) that converts the core data (e.g., formatted as multiple bits sent in parallel, such as a byte) into a serial bitstream by utilizing the serial clock signal along with the first and second sub-rate clock signals provided by transmit PLL 122. The serial bitstream at the serial clock signal rate is provided as an output signal for each channel circuit 124 on a corresponding serial output line 134. Alternatively, channel circuits 124 may represent any type of circuit that receives the core data and various clock signals provided by transmit PLL 122 to perform some desired function.

Transmit PLL 122, in general, frequency and phase locks to the reference clock signal to generate the higher-rate transmit clocks (i.e., the serial clock signal, the first sub-rate clock signal, and the second sub-rate clock signal). The serial clock signal, which is the highest-rate clock signal, is distributed to each channel circuit 124 through serial clock line 126, which can be controlled to reduce skew. For example, serial clock line 126 can be resonated to achieve very low skew across channel circuits 124, such as by terminating serial clock line 126 at its ends with a matched reactive load.

The first sub-rate clock signal, generated by transmit PLL 122, is distributed serially to each channel circuit 124 and re-timed by the serial clock signal. For example, the first sub-rate clock signal is distributed via a register-to-register transfer from one channel circuit 124 to the next channel circuit 124 and re-timed by the serial clock signal. Thus, the phase of the first sub-rate clock signal in each channel circuit 124 is substantially the same in comparison with each other and with respect to the phase of the serial clock signal.

The register-to-register transfer method of a clock signal between channel circuits, such as described above for the first sub-rate clock signal, is referred to herein as "daisy chaining" the clock. By daisy chaining the clock signal, the clock signal is distributed serially from one register to the next, which reduces the associated load and timing requirements. Furthermore, this also eliminates the requirement of a separate divider circuit, in each channel circuit 124, to divide or reduce the serial clock signal, which results in a divided clock signal of unknown phase.

The register-to-register transfer of the first sub-rate clock signal is illustrated in FIG. 1. For example, the first sub-rate clock signal, provided by transmit PLL 122 on first sub-rate clock line 128, is received by a register 132 within channel circuit 124(1). Register 132 is clocked by the serial clock signal, with an output of register 132 provided to a register 132 within channel circuit 124(2). Similarly, register 132 in channel circuit 124(2) is clocked by the serial clock signal, with an output of register 132 provided to the next channel circuit 124. This process is repeated such that the register-to-register transfer of the first sub-rate clock signal occurs through all of channel circuits 124.

The second sub-rate clock signal, generated by transmit PLL 122, can be distributed to each channel circuit 124 directly or as explained above for the first sub-rate clock signal. For example, the second sub-rate clock signal can be re-timed by its local first sub-rate clock signal (which was re-timed by the serial clock signal, as explained above), requiring a register-to-register transfer at the first sub-rate clock signal frequency. Thus, the second sub-rate clock signal may be "daisy chained" from one channel circuit 124 to the next channel circuit 124 or from one group of channel circuits 124 to the next group of channel circuits 124.

As an example, a register-to-register transfer may occur at an interval of every three channel circuits 124. Consequently, the second sub-rate clock signal is provided to all of the channel circuits 124, but with a register-to-register transfer occurring at channel circuit 124(3), channel circuit 124(6), etc.

Core circuit 104 generates the parallel streams of core data at a lower frequency clock rate (i.e., the frequency of the core clock signal) than the rate of the serial clock signal. In general, it is desired that the skew associated with the clock signals (e.g., the second sub-rate clock signal) for the channel circuits 124 is controlled with respect to the skew associated with the core clock signal. This can be accomplished in a variety of ways.

For example, as shown in FIG. 1, for large clock trees (i.e., a large clock distribution circuit 106 within core circuit 104), skew is actively compensated for by utilizing core PLL 102. For trunking, a pre-defined phase relationship is required between the core clock signal, which registers the core data at the output of core circuit 104 (i.e., clocks the core data out of registers 136), and the clock signal within channel circuits 124, which registers the data into channel circuits 124 (e.g., the second sub-rate clock signal which clocks the core data into corresponding registers 138).

A pre-defined relationship between core PLL 102 and transmit PLL 122 is initially provided for by the reference clock signal through matched lines 114 and 116, respectively. Consequently, Core PLL 102 and transmit PLL 122 receive corresponding reference signals that have the same frequency and substantially the same phase.

Core PLL 102 drives clock distribution circuit 106 that distributes the core clock signal with suitable timing and drive levels to all circuits in core circuit 104 (i.e., integrated circuit core logic) that utilize the core clock signal. Core PLL 102 also monitors the core clock signal within clock distribution circuit 106 (i.e., taps-off a version of the core clock signal), which has a phase that is representative of the phase which will register the core data into channel circuits 124.

For example, a core clock feedback line 110 is shown in FIG. 1 coupled to clock distribution circuit 106 near one of registers 136. Core clock feedback line 110 provides a feedback path for the core clock signal to core PLL 102 to allow core PLL 102 to compare the core clock signal to the reference clock signal. The feedback of the core clock signal to core PLL 102 allows core PLL 102 to compensate for delay through clock distribution circuit 106 by actively adjusting the phase of its core clock signal through core clock line 108.

Furthermore, the phase relationship between the reference clock signal and the core clock signal, which is used for registering core data into channel circuits 124, will be independent of variables, such as temperature, voltage, process or manufacturing variations, etc. Thus, core PLL 102 monitors the core clock signal and compensates for variables that would normally alter the delay or timing of the core clock signal through clock distribution circuit 106.

Core PLL 102 ensures that the core clock signal is phase aligned to the reference clock signal and ultimately, as discussed above, to the clock signals (i.e., the serial clock signal, the first sub-rate clock signal, and the second sub-rate clock signal) produced by transmit PLL 122. For example, as shown in FIG. 1, the second sub-rate clock signal clocks the core data into registers 138, while the core clock signal clocks the core data out of corresponding registers 136. The core clock signal and the second sub-rate clock signal are equal in frequency and substantially in phase, because core PLL 102 and transmit PLL 122, which generate the core clock signal and the second sub-rate clock signal, respectively, are locked in frequency and phase to the reference clock signal.

If the clock distribution circuit 106 is not extensive, then core PLL 102 is not required. Core PLL 102 ensures that the phase of the core clock signal is substantially the same as the second sub-rate clock signal. If the core clock tree (i.e., clock distribution circuit 106) is controlled such that the delay is known and bounded, then it is possible to operate without core PLL 102. For example, the skew of the core clock signal and the second sub-rate clock signal, for smaller clock trees, can be bounded to allow for a register-to-register transfer of the core data at the core clock signal rate from core circuit 104 to channel circuits 124 at the second sub-rate clock signal rate. Thus, the skew of the core clock signal at the ends of the clock tree or clock distribution circuit 106, where the core data is clocked (i.e., at registers 136), must be carefully controlled.

Figure 2:
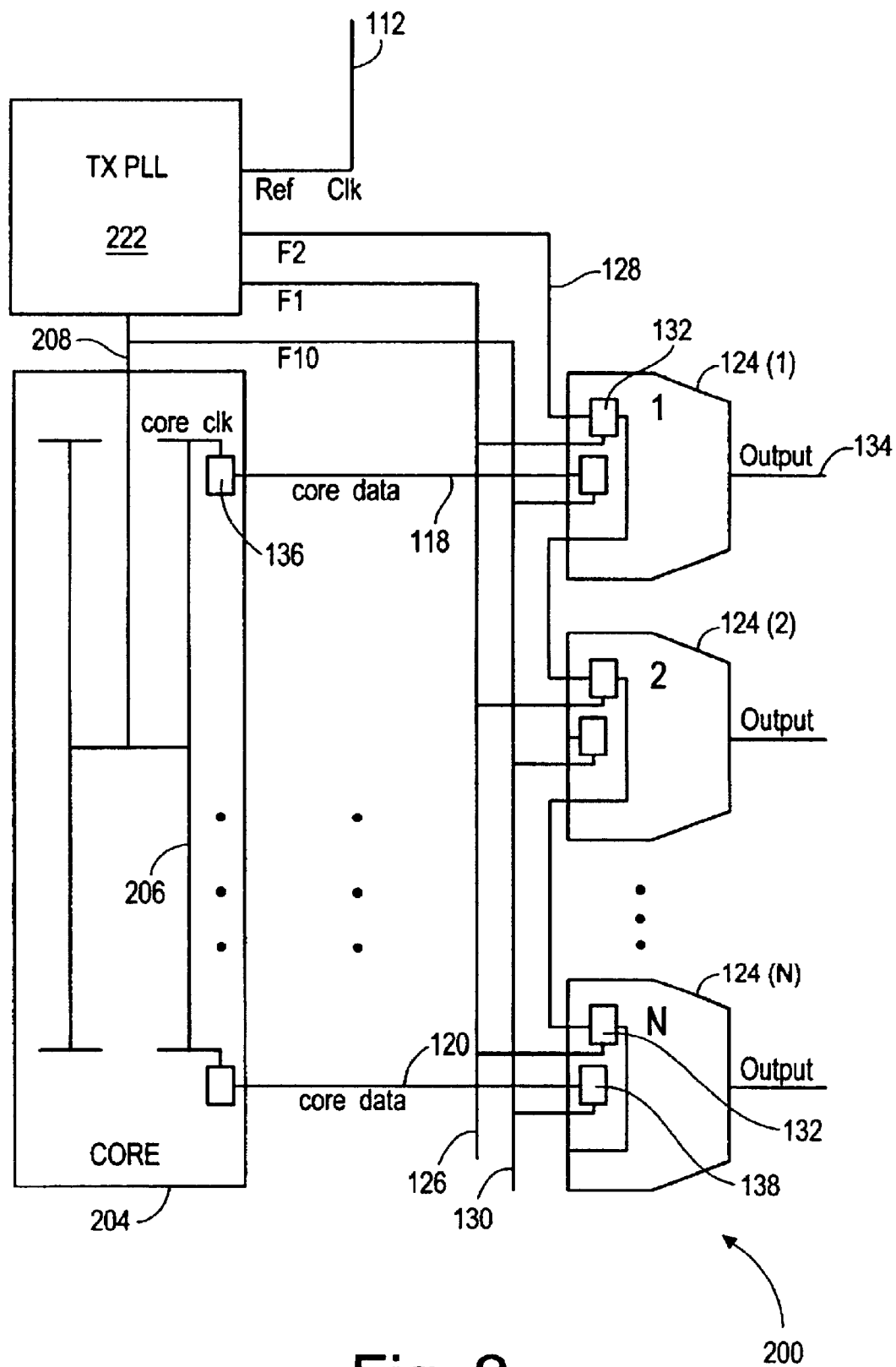
FIG. 2 shows a block diagram illustrating a system for generating and synchronizing multiple clocks in accordance with a second embodiment of the present invention.

FIG. 2 shows a block diagram illustrating a system 200 for generating and synchronizing multiple clocks in accordance with a second embodiment of the present invention. System 200 includes a core circuit 204, a clock distribution circuit 206, and a transmit PLL 222. System 200 is similar to system 100, discussed above, but differs by illustrating a system for generating and synchronizing multiple clocks without core PLL 102.

Transmit PLL 222 receives the reference clock signal from reference clock line 112 and generates the serial clock signal (F1), the first sub-rate clock signal (F2), and the second sub-rate clock signal (F10). Because system 200 does not have a core PLL, matched lines 114 and 116 are not required and transmit PLL 222 provides the second sub-rate clock signal to core circuit 204 through a core clock line 208.

Core clock line 208 is coupled to a clock distribution circuit 206 within core circuit 204. Clock distribution circuit 206 is not as extensive as clock distribution circuit 106 (discussed above in reference to FIG. 1). Therefore, the skew of the second sub-rate clock signal (i.e., the core clock signal of core circuit 204) is sufficiently bounded to permit register-to-register transfers of the core data from core circuit 204 to channel circuits 124.

Figure 3:
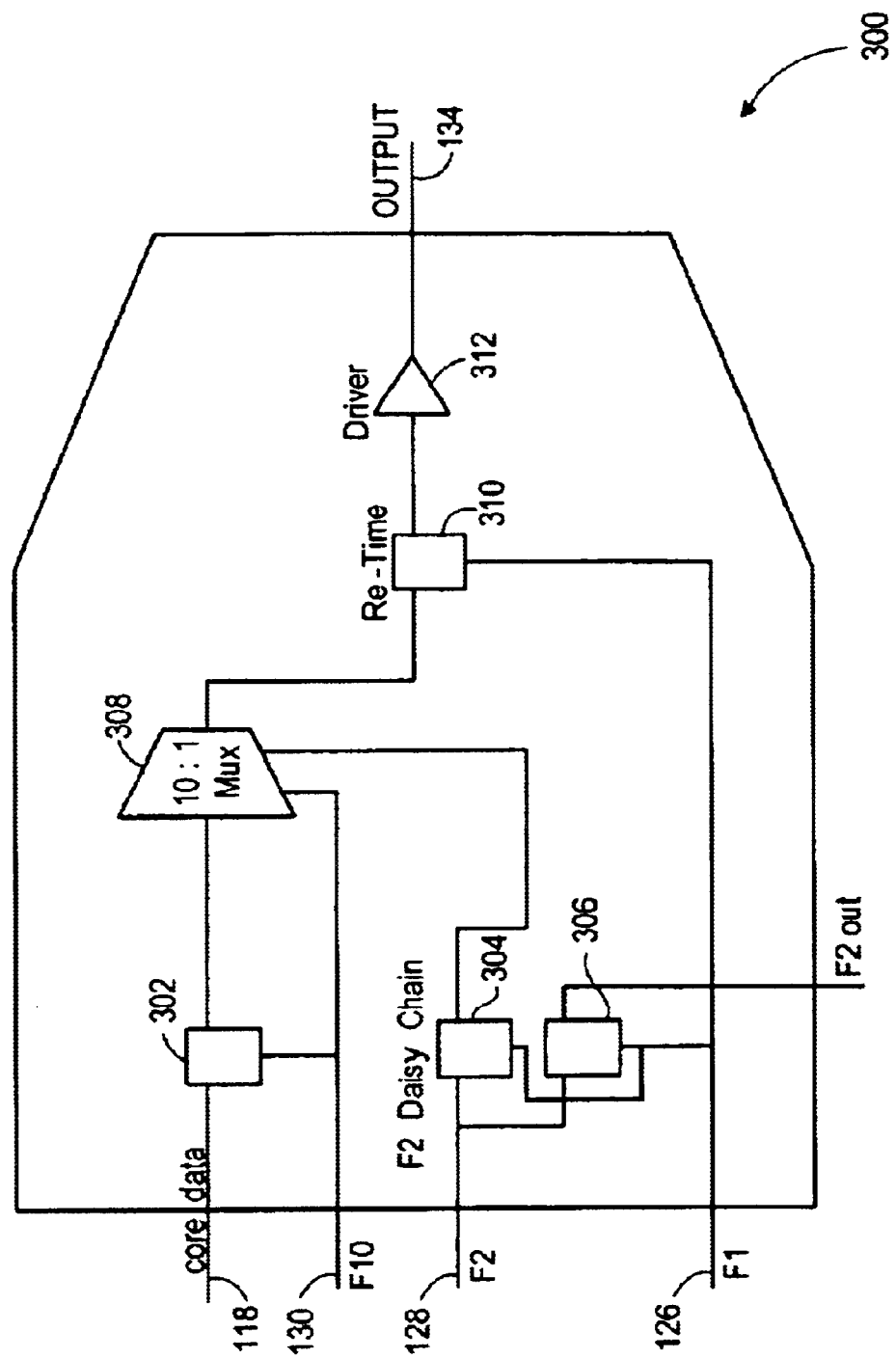
FIG. 3 shows an exemplary circuit diagram for a portion of the system shown in FIGS. 1 and 2.

FIG. 3 shows an exemplary circuit diagram 300 for channel circuit 124 (e.g., channel circuit 124(1)). Circuit diagram 300 includes registers 302, 304, 306, and 310, a multiplexer 308, and a driver 312. Register 302 receives the core data (e.g., transmitted on exemplary core data line 118) and provides the core data to multiplexer 308, with the core data clocked into register 302 and multiplexer 308 by the second sub-rate clock signal (F10). The core data is clocked out of multiplexer 308 by the first sub-rate clock signal (F2) at the serial clock signal rate by using the leading and trailing edge of the first sub-rate clock signal.

The core data clocked out of multiplexer 308 is re-timed by register 310, whose clock is controlled by the serial clock signal (F1). Driver 312 drives the core data, which is now formatted from a multi-bit parallel data stream (e.g., 10-bit) to a serial data stream, onto serial output line 134.

It should be understood that core data line 118 transfers multiple bits in a parallel fashion between corresponding registers 136 and 138 coupled to core data line 118 (as shown in FIG. 1). For example, if the core data is generated as 10-bit words, then core data line 118 represents ten parallel lines for transferring each word of core data as ten parallel bits from ten registers 136 in core circuit 104 to ten corresponding registers 138 in channel circuit 124(1). Referring to FIG. 3 and continuing with the example, register 302 represents a bank of ten registers, each corresponding to one of the ten parallel lines of core data line 118. Each register is clocked by the second sub-rate clock signal and provides the output signal to a corresponding input terminal of multiplexer 308.

As shown in FIG. 3, the first sub-rate clock signal (F2) is re-timed by the serial clock signal (F1) concurrently using registers 304 and 306. The output signal of register 304 is provided to multiplexer 308, while the output signal of register 306 is provided to the next channel circuit 124 (e.g., channel circuit 124(2)). Register 306 illustrates the daisy chain method or register-to-register transfer of the first sub-rate clock signal. Registers 304 and 306 could alternatively be replaced by register 132, as shown in FIG. 1, with the output signal of register 132 provided to multiplexer 308 (in current channel circuit 124) and also to register 132 in the next channel circuit 124.

Figure 4:
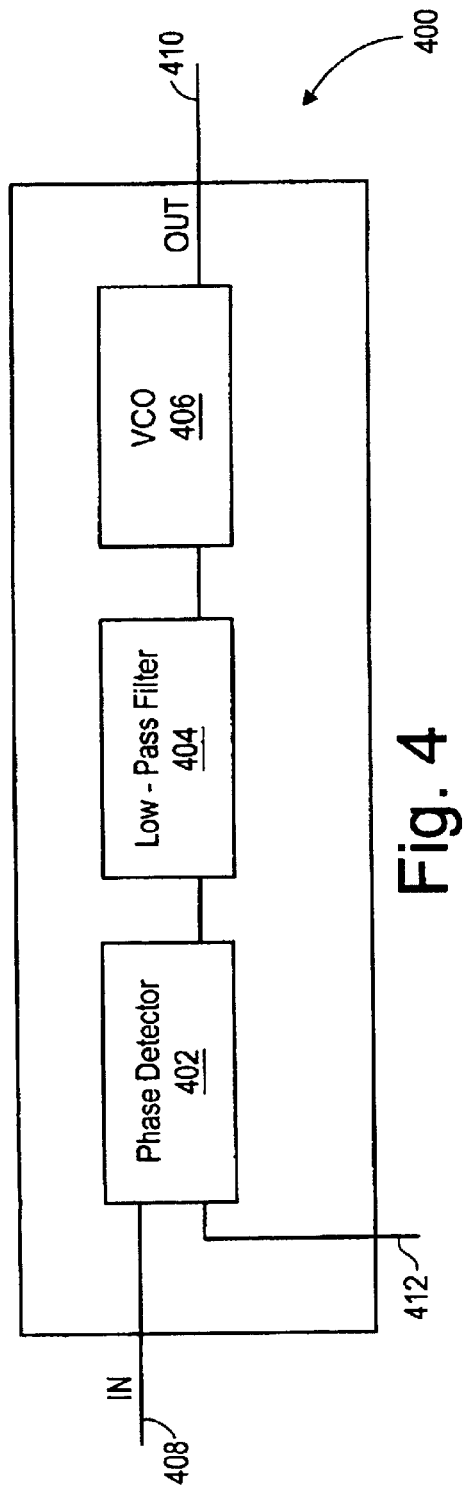
FIG. 4 shows an exemplary phase-locked loop circuit diagram for a portion of the system shown in FIG. 1.

FIG. 4 shows an exemplary phase-locked loop circuit diagram 400 for core PLL 102 shown in FIG. 1. PLL circuit diagram 400 includes a phase detector 402, a loop filter 404 (e.g., a low-pass filter), and a voltage controlled oscillator (VCO) 406. PLL circuit diagram 400 receives a reference signal at an input terminal 408 (labeled IN in FIG. 4) and a feedback signal at an input terminal 412 and provides an output signal at an output terminal 410 (labeled OUT in FIG. 4).

Phase detector 402 (i.e., timing detector) compares the phase of the reference signal (or a harmonic or sub-harmonic) at input terminal 408 to the phase of the output signal (or a harmonic or sub-harmonic) at output terminal 410 or a signal derived from the output signal, which is provided at input terminal 412. Based on the comparison, phase detector 402 along with loop filter 404 controls the frequency and phase of the output signal from VCO 406 to get the desired phase relationship between the two input signals (i.e., the reference signal and the feedback signal) provided to phase detector 402.

For example, if PLL circuit diagram 400 were to be substituted for core PLL 102 in FIG. 1, the reference clock signal provided through matched line 114 would be received at input terminal 408. The core clock signal would be provided through output terminal 410 and core clock line 108 to clock distribution circuit 106. Core clock feedback line 110 would couple to input terminal 412 to provide a feedback version of the core clock signal from clock distribution circuit 106. Phase detector 402 would then compare the feedback version of the core clock signal to the reference clock signal to adjust VCO 406 and compensate for delay through clock distribution circuit 106, as discussed herein.

Figure 5:
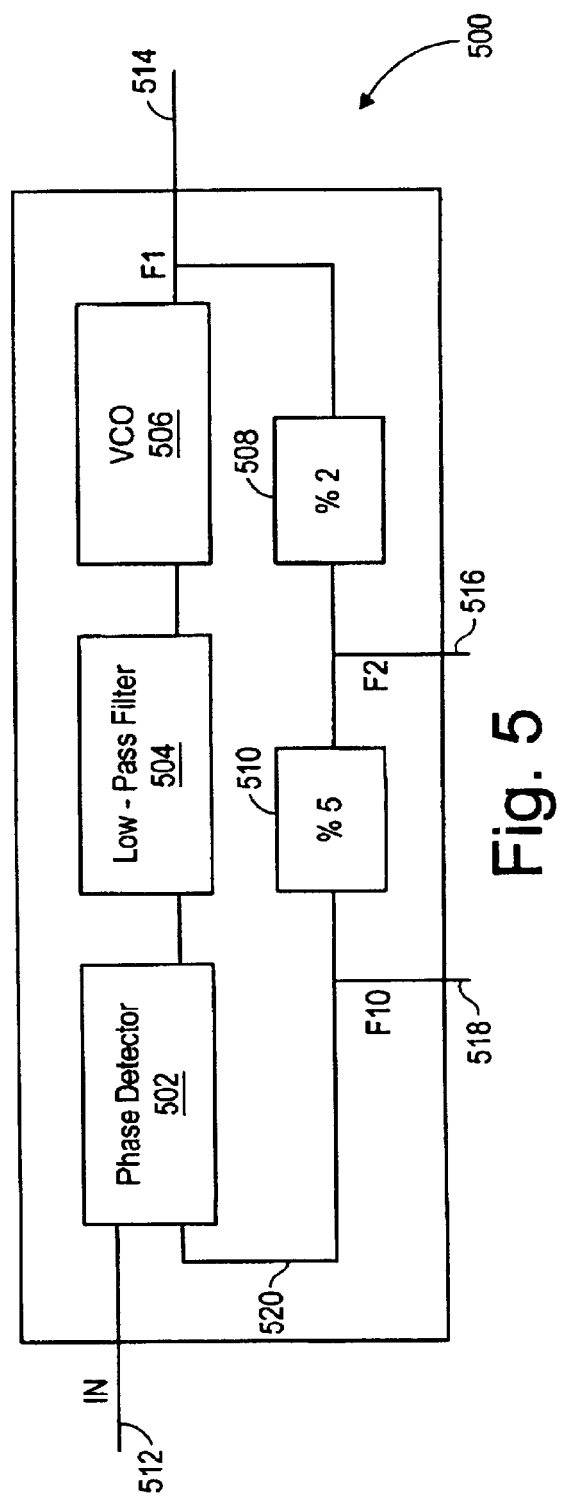
FIG. 5 shows an exemplary phase-locked loop circuit diagram for another portion of the system shown in FIGS. 1 and 2.

FIG. 5 shows an exemplary phase-locked loop circuit diagram 500 for transmit PLL 122 or transmit PLL 222 shown in FIGS. 1 and 2, respectively. PLL circuit diagram 500 includes a phase detector 502, a loop filter 504 (e.g., a low-pass filter), a VCO 506, a first divider 508, and a second divider 510. PLL circuit diagram 500 receives a reference signal at an input terminal 512 (labeled IN in FIG. 5) and a feedback signal through a feedback path 520 and provides a first output signal at an output terminal 514 (labeled F1), a second output signal at an output terminal 516 (labeled F2), and a third output signal at an output terminal 518 (labeled F10).

PLL circuit diagram 500 functions in a similar fashion as described above for PLL circuit diagram 400, but includes first and second dividers 508 and 510. First divider 508 divides the first output signal by two, which is further divided by five by second divider 510, such that the third output signal is one-tenth the frequency of the first output signal. First and second dividers 508 and 510 also forces the generation by VCO 506 of higher-order harmonics of the reference signal received at input terminal 512.

As noted above, PLL circuit diagram 500 is an exemplary circuit diagram for transmit PLL 122 or transmit PLL 222. For example, if PLL circuit diagram 500 were to be substituted for transmit PLL 122 in FIG. 1, the reference clock signal provided through matched line 116 would be received at input terminal 512. The serial clock signal, the first sub-rate clock signal, and the second sub-rate clock signal would correspond to the first output signal, the second output signal, and the third output signal, respectively.

Figure 6:
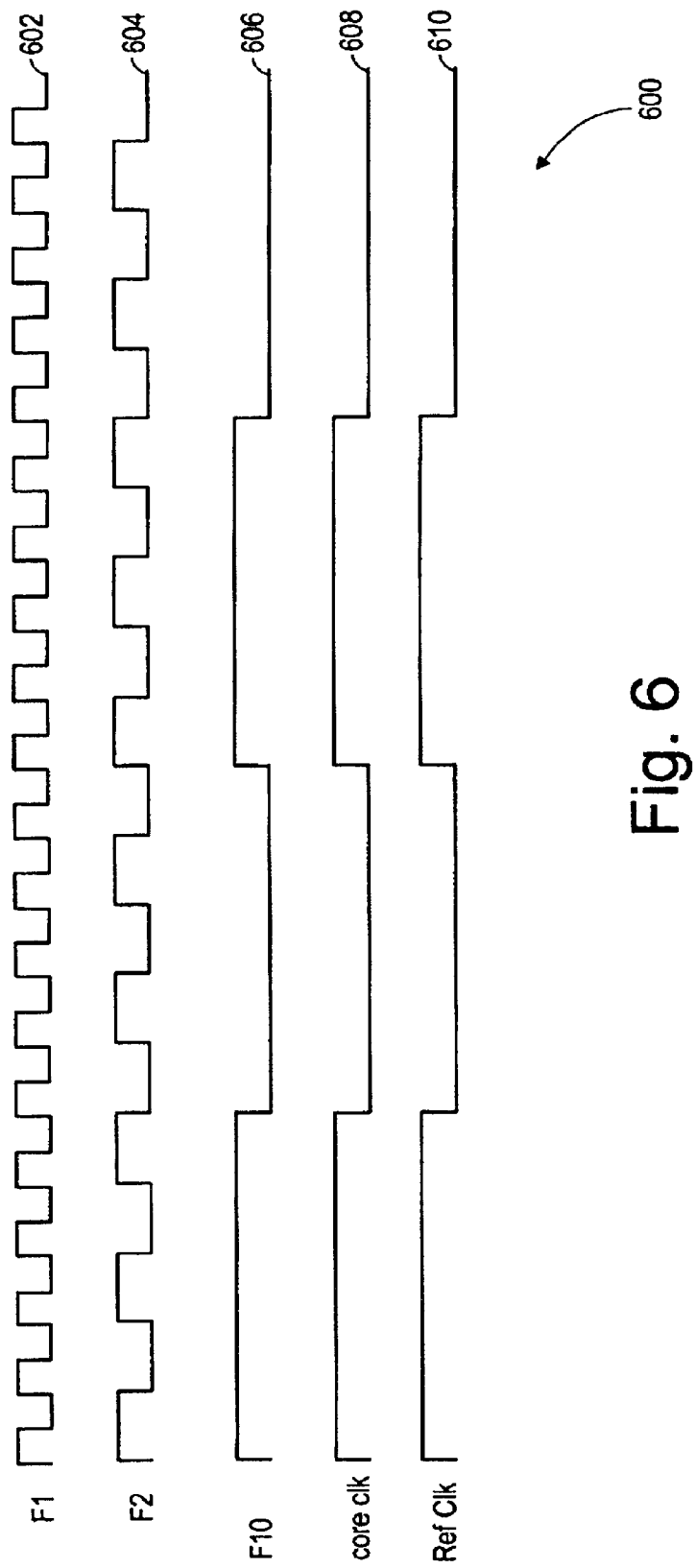
FIG. 6 shows an exemplary timing diagram for various signal waveforms identified in FIG. 1.

FIG. 6 shows an exemplary timing diagram 600 for various signal waveforms identified in FIG. 1. Signal waveforms 602 (labeled F1 in FIG. 6), 604 (labeled F2), 606 (labeled F10), 608 (labeled core clk), and 610 (labeled ref clk) correspond to the serial clock signal, the first sub-rate clock signal, the second sub-rate clock signal, the core clock signal, and the reference clock signal, respectively. In general, timing diagram 600 shows the relative phases and frequencies of the clock signals.

Transmit PLL 122 and the clock distribution system, which includes clock distribution circuit 106, serial clock line 126, first sub-rate clock line 128, and second sub-rate clock line 130, form a clock synchronization system, which may include core PLL 102 depending upon the specifications of clock distribution circuit 106. The clock synchronization system provides for the synchronized transmission of data from a given circuit through multiple channels. As explained herein, each clock in every channel (i.e., channel circuit 124) has the same phase relationship and will be independent of temperature, voltage, process, and manufacturing variations. Thus, the data streams in each channel have very low skew. Furthermore, because all of the phase relationships of the clocks, including the core clock signal, are well defined, the absolute latency of the system is well defined.

Embodiments described above illustrate but do not limit the invention. It should also be understood that numerous modifications and variations are possible in accordance with the principles of the present invention. Accordingly, the scope of the invention is defined only by the following claims.

We claim:

1. A system for synchronizing a plurality of data channels, the system comprising:

a core circuit having a clock distribution circuit, the core circuit providing a plurality of data streams at a frequency of a core clock signal carried by the clock distribution circuit;

a first phase-locked loop circuit generating a plurality of clock signals, wherein a first clock signal from the plurality of clock signals has the same frequency and substantially the same phase as the core clock signal carried by the clock distribution circuit; and a plurality of channel circuits coupled to the core circuit and to the first phase-locked loop circuit, the channel circuits converting the plurality of data streams, received at a frequency of the first clock signal, into a plurality of serial data streams at a frequency of a second clock signal from the plurality of clock signals.

2. The system of claim 1, further comprising a second phase-locked loop circuit coupled to the core circuit, the second phase-locked loop circuit generating the core clock signal and providing the core clock signal to the clock distribution circuit.

3. The system of claim 2, wherein the second phase-locked loop circuit receives a sampled version of the core clock signal from the clock distribution circuit to compensate for timing differences associated with the clock distribution circuit.

4. The system of claim 2, wherein the first phase-locked loop circuit and the second phase-locked loop circuit receive a reference signal through matched lines, which is used as a frequency and phase reference.

5. The system of claim 1, wherein a predefined phase relationship exists among the plurality of clock signals and the core clock signal carried by the clock distribution circuit.

6. The system of claim 1, wherein the second clock signal is distributed on a signal line having minimal skew to each of the plurality of channel circuits.

7. The system of claim 1, wherein at least one of the plurality of clock signals is distributed to at least some of the plurality of channel circuits via a register-to-register transfer.

8. The system of claim 7, wherein each register is clocked by the second clock signal.

9. The system of claim 1, wherein the first phase-locked loop circuit is coupled to the core circuit, the first phase-locked loop circuit providing the core clock signal to the clock distribution circuit.

10. A method of synchronizing a plurality of data channels, the method comprising:

receiving a reference clock signal;

generating a plurality of clock signals based on the reference clock signal and providing a core clock signal from the plurality of clock signals to a core circuit, wherein data is transferred from the core circuit through a plurality of data paths at a clock rate of the core clock signal;

receiving the data, transferred through the plurality of data paths, by corresponding channel circuits at a clock rate of a first clock signal from the plurality of clock signals, the first clock signal having the same frequency and substantially the same phase as the core clock signal; and transforming the data received by each of the channel circuits from a parallel to a serial data stream at a clock rate of a second clock signal from the plurality of clock signals.

11. The method of claim 10, wherein the plurality of clock signals are generated with a predefined frequency and phase relationship relative to each other and to the reference clock signal.

12. The method of claim 10, further comprising sampling a version of the core clock signal within the core circuit and adjusting a phase of the core clock signal to compensate for timing variations within the core circuit.

13. The method of claim 10, further comprising controlling the distribution of the second clock signal to each of the channel circuits to minimize skew.

14. The method of claim 10, further comprising distributing at least one of the plurality of clock signals to each of the channel circuits by a register-to-register transfer.

15. The method of claim 14, wherein each of the registers is clocked by the second clock signal.

16. A system comprising:
a first phase-locked loop circuit generating a plurality of clock signals, including a first clock signal; and
a plurality of channel circuits, coupled to the first phase-locked loop circuit, that each receive a data stream from a core circuit at a frequency of a core clock signal which has the same frequency and substantially the same phase as the first clock signal, wherein at least one of the plurality of clock signals is distributed to at least some of the plurality of channel circuits via a register-to-register transfer.

17. The system of claim 16, wherein the register-to-register transfer occurs at a frequency of a second clock signal from the plurality of clock signals.

* * * * *